(12) United States Patent
Herbsommer et al.

(10) Patent No.: US 10,374,621 B2
(45) Date of Patent: Aug. 6, 2019

(54) METHOD AND APPARATUS TO REDUCE THE LEAKAGE RATE OF A HERMETIC CAVITY

(71) Applicant: Texas Instruments Incorporated, Dallas, TX (US)

(72) Inventors: Juan Herbsommer, Allen, TX (US); Benjamin Cook, Addison, TX (US); S. Josh Jacobs, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 258 days.

(21) Appl. No.: 15/366,335

(22) Filed: Dec. 1, 2016

(65) Prior Publication Data

US 2018/0159547 A1 Jun. 7, 2018

(51) Int. Cl.
| | |
|---|---|
| *H01S 1/06* | (2006.01) |
| *H03B 17/00* | (2006.01) |
| *H03L 7/26* | (2006.01) |
| *H01L 23/00* | (2006.01) |
| *H01L 29/06* | (2006.01) |

(52) U.S. Cl.
CPC ............... *H03L 7/26* (2013.01); *H01L 24/06* (2013.01); *H01L 24/46* (2013.01); *H01L 24/83* (2013.01); *H01L 29/0649* (2013.01); *H01L 2224/11* (2013.01); *H01L 2224/48091* (2013.01)

(58) Field of Classification Search
CPC . H03L 7/26; H01L 24/83; H01L 24/46; H01L 29/0649; H01L 24/06; H01L 2224/11; H01L 2224/48091; H01L 2924/00014
USPC .............................. 331/3, 94.1; 324/352, 450
See application file for complete search history.

(56) References Cited

U.S. PATENT DOCUMENTS

| | | | |
|---|---|---|---|
| 7,666,485 B2* | 2/2010 | Lal ............................ | G04F 5/14 331/94.1 |
| 2013/0176703 A1* | 7/2013 | Hopper ..................... | H03L 7/26 361/820 |
| 2015/0027908 A1* | 1/2015 | Parsa ........................ | F17C 3/00 206/0.7 |
| 2016/0313418 A1* | 10/2016 | Fujii ...................... | G01R 33/26 |

* cited by examiner

*Primary Examiner* — Richard Tan
(74) *Attorney, Agent, or Firm* — Michael A. Davis, Jr.; Charles A. Brill; Frank D. Cimino (57) ABSTRACT

A chip scale vapor cell and millimeter wave atomic clock apparatus are disclosed. The chip scale vapor cell includes a first substrate and a second substrate bonded to the first substrate with a bonding material. A primary hermetic cavity includes a first bottom wall and first sidewalls formed in the first substrate and a first top wall formed by the lower surface of the second substrate. A secondary hermetic cavity includes a second bottom wall and second sidewalls formed in the first substrate and a second top wall formed by the lower surface of the second substrate. The secondary hermetic cavity is separate from the primary hermetic cavity and surrounds the perimeter of the primary hermetic cavity. A gas, which can be a dipolar molecular gas, is sealed in the primary hermetic cavity and the secondary hermetic cavity at a given initial pressure.

16 Claims, 10 Drawing Sheets

METHOD AND APPARATUS TO REDUCE THE LEAKAGE RATE OF A HERMETIC CAVITY

FIELD OF THE DISCLOSURE

Disclosed embodiments relate generally to the field of hermetic cavities. More particularly, and not by way of any limitation, the present disclosure is directed to a method and apparatus to reduce the leakage rate of a hermetic cavity.

BACKGROUND

Atomic clocks are essential to today's increasingly digitized world and are being provided in miniaturized forms as chip scale atomic clocks (CSACs). Atomic clocks use the frequency of the electronic transition of an alkali metal vapor as a frequency reference. Alkali metal gases, such as cesium, rubidium or other atoms with a single electron in the outer shell, undergo optical transitions at very high discrete frequencies in the hundreds of GHz, e.g., optical wavelengths of around 800-900 nm. Atomic clocks optically interrogate a vaporized alkali gas over a bandwidth that includes the transition frequency; several techniques including optical absorption, electrically induced optical transparency, and coherent population trapping are used to define the frequency of the optical transition. These atomic clocks have multiple issues, e.g., a requirement for thermal stability of both the laser optical source and the electronic transition vapor cell (often requiring heating circuitry), complex circuitry and magnetic shielding. Accordingly, these clocks suffer from relatively high power consumption, as well as additional costs and space for the required circuitry and optical components.

Work is now being done to develop millimeter wave CSACs that use the rotational transition of a dipolar molecular vapor, e.g., $H_2O$, as millimeter wave CSACs may allow the use of less complex circuitry than atomic clocks. A major challenge in millimeter wave CSACs is to maintain a very low pressure inside a hermetic cavity containing the dipolar molecule vapor for an extended period of time, e.g., three to five years. The quality factor of the transition to be measured quickly degrades when the pressure inside the cavity increases. Desirable leakage rates are not achievable using current wafer bonding techniques.

SUMMARY

Disclosed embodiments provide a primary hermetic cavity that can be used as a vapor cell for a millimeter wave CSAC, e.g., a CSAC based on the quantum molecular rotational transition of water molecules at 183 GHz. The hermetic cavity may also be utilized, for example, in experimental physics, biotechnology, space research or lab-on-a-chip applications. The primary hermetic cavity has a defined level of moisture and must be maintained with a very low internal pressure, which in one embodiment is 0.1 mBar. A secondary hermetic cavity, which is sealed simultaneously with the primary cavity, surrounds the perimeter of the primary cavity. The secondary cavity contains an initial internal atmosphere that is identical to the internal atmosphere of the primary cavity and provides a buffer zone for leakage from the environment. Leakage must first cross the secondary cavity to gain access to the primary cavity, thus slowing the leakage rate into the primary cavity.

In one aspect, an embodiment of a chip scale vapor cell is disclosed. The chip scale vapor cell includes a first substrate; a second substrate bonded to the first substrate with a bonding material, the second substrate comprising an upper surface and a lower surface; a primary hermetic cavity comprising a first bottom wall and first sidewalls formed in the first substrate and a first top wall formed by the lower surface of the second substrate; a secondary hermetic cavity comprising a second bottom wall and second sidewalls formed in the first substrate, a second top wall formed by the lower surface of the second substrate, the secondary hermetic cavity being separate from the primary hermetic cavity and surrounding a perimeter of the primary hermetic cavity; and a gas sealed in the primary hermetic cavity and the secondary hermetic cavity at a given initial pressure.

In another aspect, an embodiment of a millimeter wave atomic clock apparatus is disclosed. The millimeter wave atomic clock apparatus includes a vapor cell, comprising: a first substrate, a second substrate bonded to the first substrate with a bonding material, the second substrate comprising an upper surface and a lower surface, a primary hermetic cavity comprising a first bottom wall and first sidewalls formed in the first substrate and a first top wall formed by the lower surface of the second substrate, a secondary hermetic cavity comprising a second bottom wall and second sidewalls formed in the first substrate, a second top wall formed by the lower surface of the second substrate, the secondary hermetic cavity being separate from the primary hermetic cavity, the secondary hermetic cavity surrounding a perimeter of the primary hermetic cavity and a dipolar molecular gas sealed in the primary hermetic cavity and the secondary hermetic cavity at a given initial pressure; and a transceiver circuit mounted to the second substrate and electrically coupled to provide an alternating electrical output signal at a first end of the primary hermetic cavity and to receive an alternating electrical input signal at a second end of the primary hermetic cavity, the transceiver circuit coupled to selectively adjust a frequency of the alternating electrical output signal and to provide a reference clock signal.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as In "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 5:
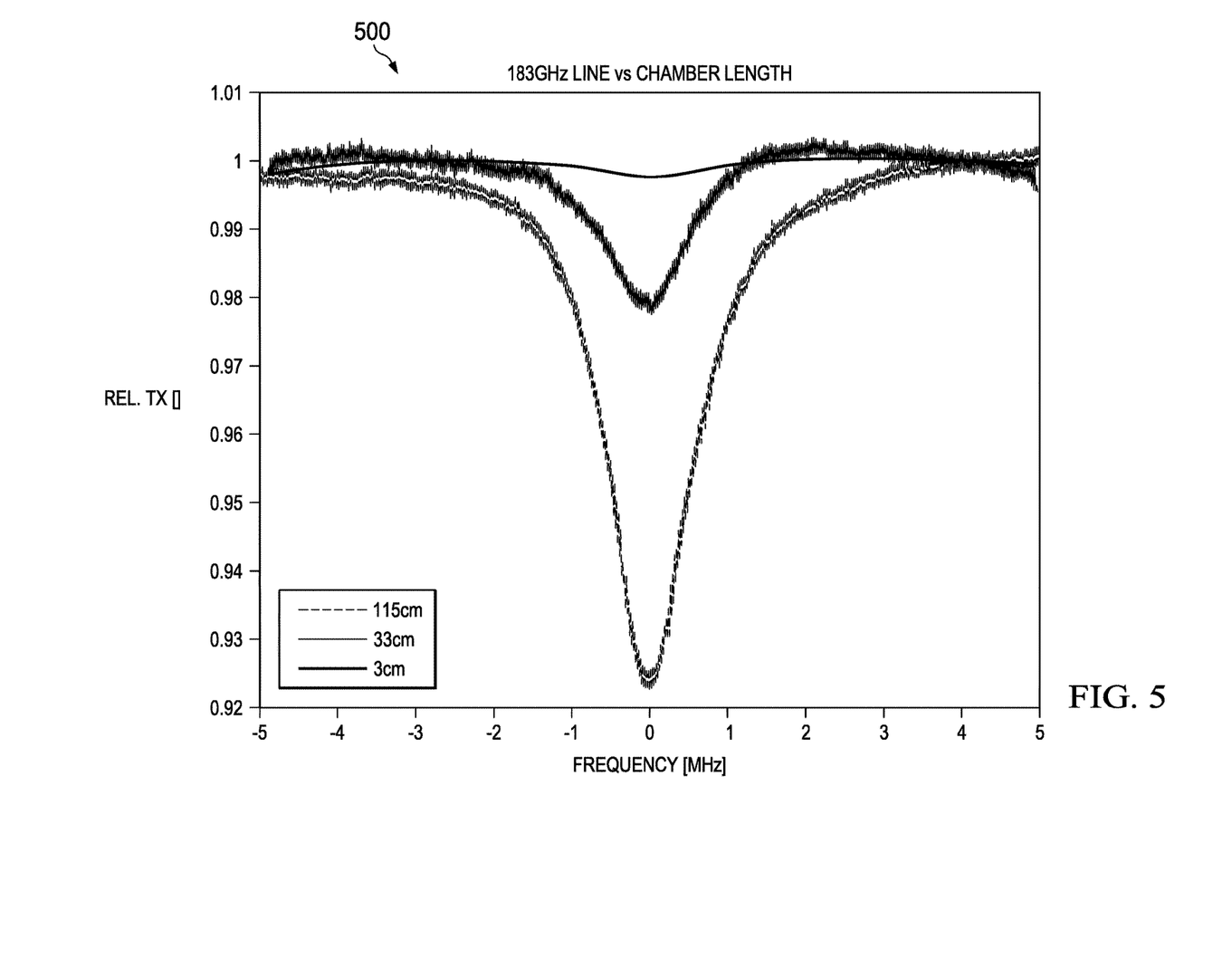
FIG. 5 depicts various factors that influence atomic clock stability.

As millimeter-wave CSAC are being developed, numerous factors that affect the success of these devices must be considered. One factor is the quality of the absorption line used to provide the reference frequency. Some elements that are used to determine the stability of an atomic clock are shown in FIG. 5 and include the transition frequency $f_0$, the magnitude of the signal S, the magnitude of the noise N, the linewidth γ, which is measured at half the maximum signal, and the DC offset level DC. The quality factor Q of the absorption line is equal to $\gamma/f_0$. In addition, the fundamental definition of atomic clock stability can be stated by Equation 1:

$$\sigma_y(\tau) \sim \frac{1}{Q(S/N)\sqrt{\tau}} \quad \text{Equation 1}$$

where τ represents time in seconds. It is clear from Equation 1 that the stability of the atomic clock is inversely proportional to the quality factor.

Figure 6:
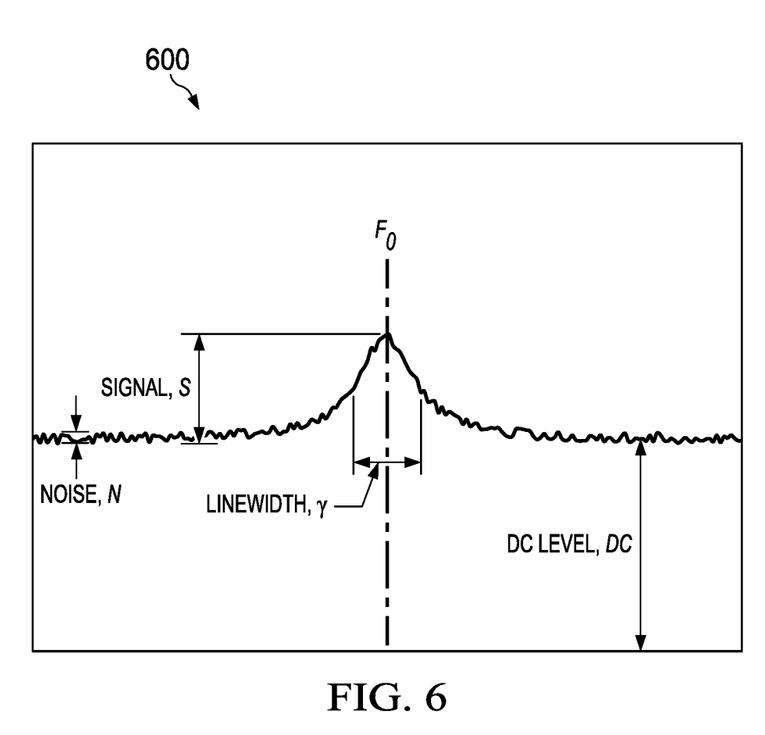
FIG. 6 depicts a graph of the quality of the 183 GHz absorption line versus the length of the testing chamber.

FIG. 6 discloses a graph 600 depicting the absorption peak as a function of frequency for different lengths of the chamber being interrogated, i.e., the vapor cell. Clearly, as the length of the vapor cell is shortened from 115 cm long to 33 cm and then to 3 cm, the amplitude of the peak decreases sharply. This is because as the cavity becomes shorter, fewer molecules are being interrogated, leading of a smaller absorption peak.

Figure 7:
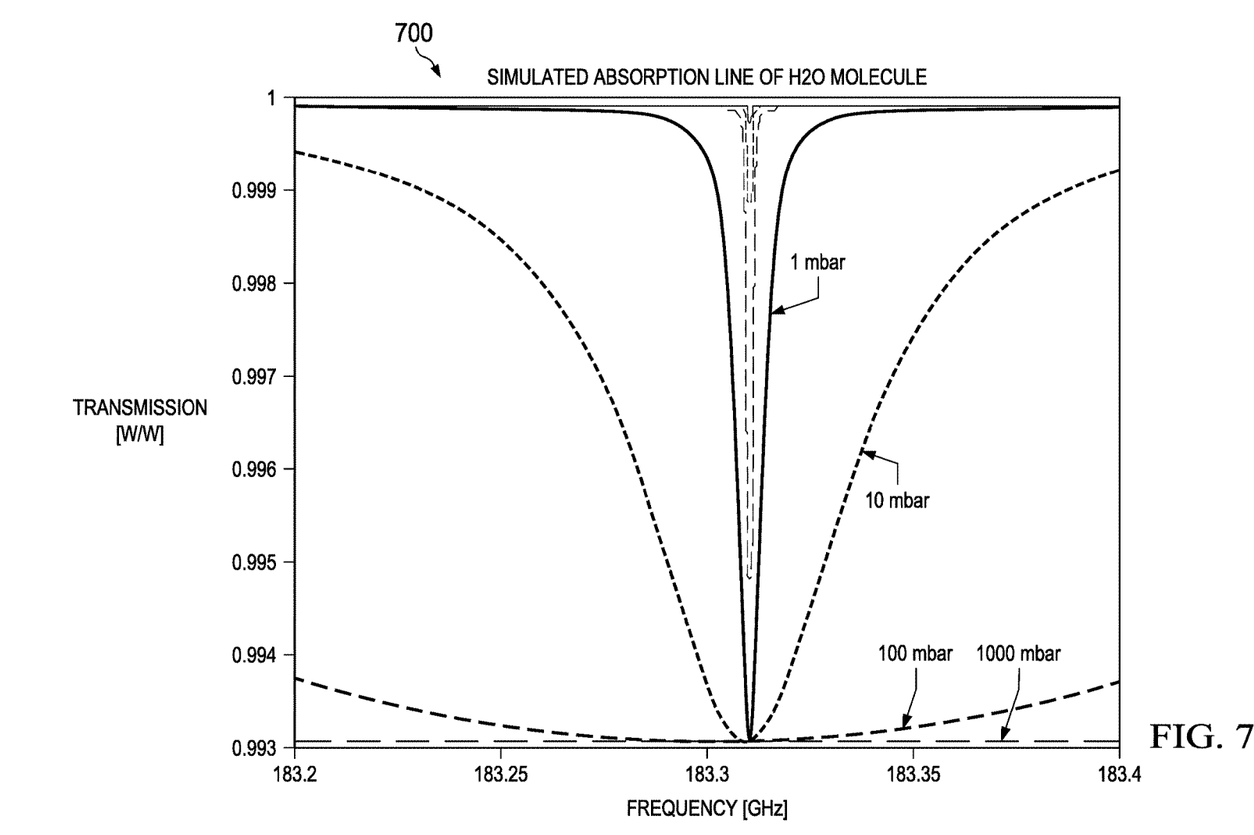
FIG. 7 is a graph of the simulated absorption line of water molecules as measured at various pressures.

The main factor that affects the quality of the absorption line is the pressure in the vapor cell (phenomenon know as 'pressure broadening"). FIG. 7 depicts a graph 700 that depicts pressure inside the vapor cell versus the quality factor of the simulated absorption line. The simulated absorption line of water molecules is almost flat at 1000 mbar, which is roughly atmospheric pressure at sea level, and is only marginally better at 100 mbar. Successive absorption lines in the graph represent 10 mbar, 1 mbar, 0.1 mbar and 0.01 mbar respectively. As the pressure within the vapor chamber is lowered, the magnitude of the associated signal S drops, but the linewidth γ drops even faster. In order to achieve a desired Q value for a CSAC, a pressure inside the vapor cell of 0.1 mbar is required.

Not only must this low pressure be established when the chip is fabricated, but the low pressure must be maintained for a reasonable period of time. In order to achieve 1000 days post-seal of the desired low pressure, which is defined as a 100% increase in the internal pressure of the vapor cell, a leakage rate of 1.72E-14 atm-cc/s of air for the vapor cell must be achieved. The leaked gasses have the same composition as the external environment, assuming a 1 atm gas environment. Most hermetic seals, including Au—Au thermocompression seals, have leakage rates that fall within a wide range between 1E-12-1E-10 atm-cc/s. Accordingly, current sealing technologies alone cannot begin to meet the leakage rates required in the vapor cells to make viable chip-scale CSACs using water molecules.

Figure 1A:
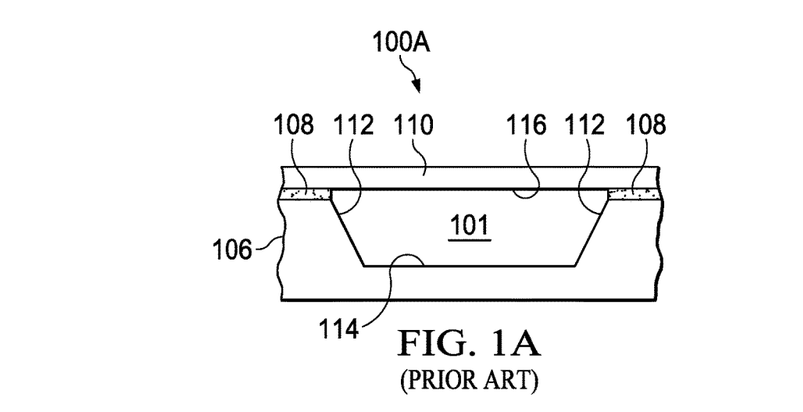
FIG. 1A depicts an example cross-section of a vapor cell according to the prior art.

Turning next to FIG. 1A, a cross-section of a chip scale vapor cell 100A according to the prior art is shown. Vapor cell 100A comprises a hermetic cavity 101 formed primarily in a first substrate 106, which can be a semiconductor substrate such as a silicon wafer. Hermetic cavity 101 includes sidewalls 112 and a bottom wall 114 that are formed in first substrate 106. A top wall 116 of hermetic cavity 101 is formed by a second substrate 110, which can be, for example, a second semiconductor wafer or a sheet of glass. The second substrate 110 is bonded to first substrate 106 using a bonding material 108, which can be an Au—Au seal. As noted previously, the leakage rate of hermetic cavity 101 means that the required low pressure inside hermetic cavity 101 cannot be maintained for a desired period of time.

Figure 1B:
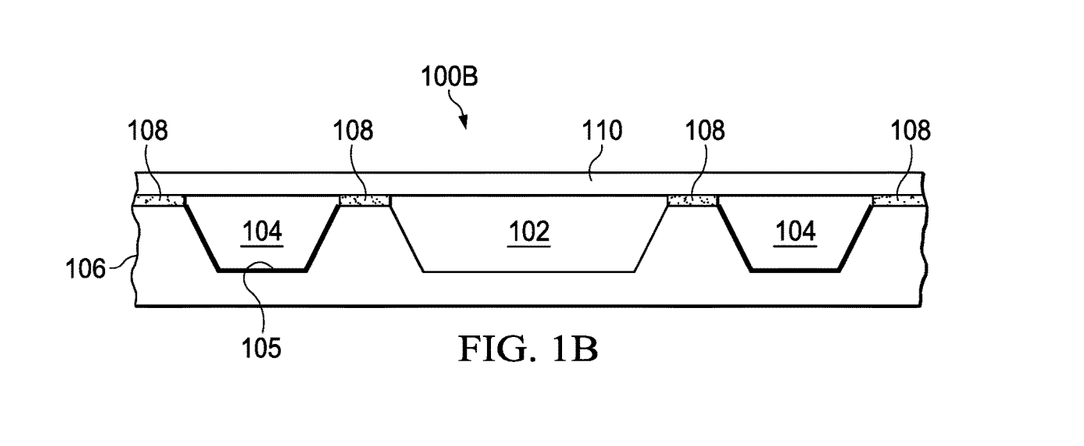
FIG. 1B depicts an example cross-section of a vapor cell having a buffer cell according to an embodiment of the disclosure.
Figure 2A:
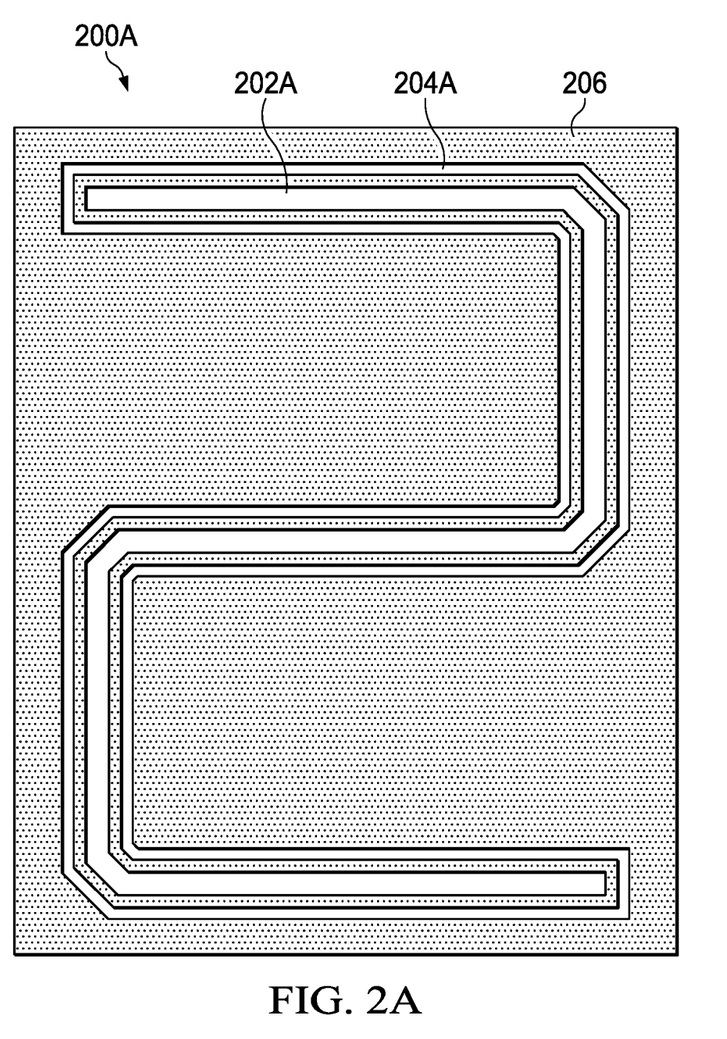
FIG. 2A depicts an example top view of a substrate with primary and secondary cavities formed in a serpentine pattern.
Figure 2B:
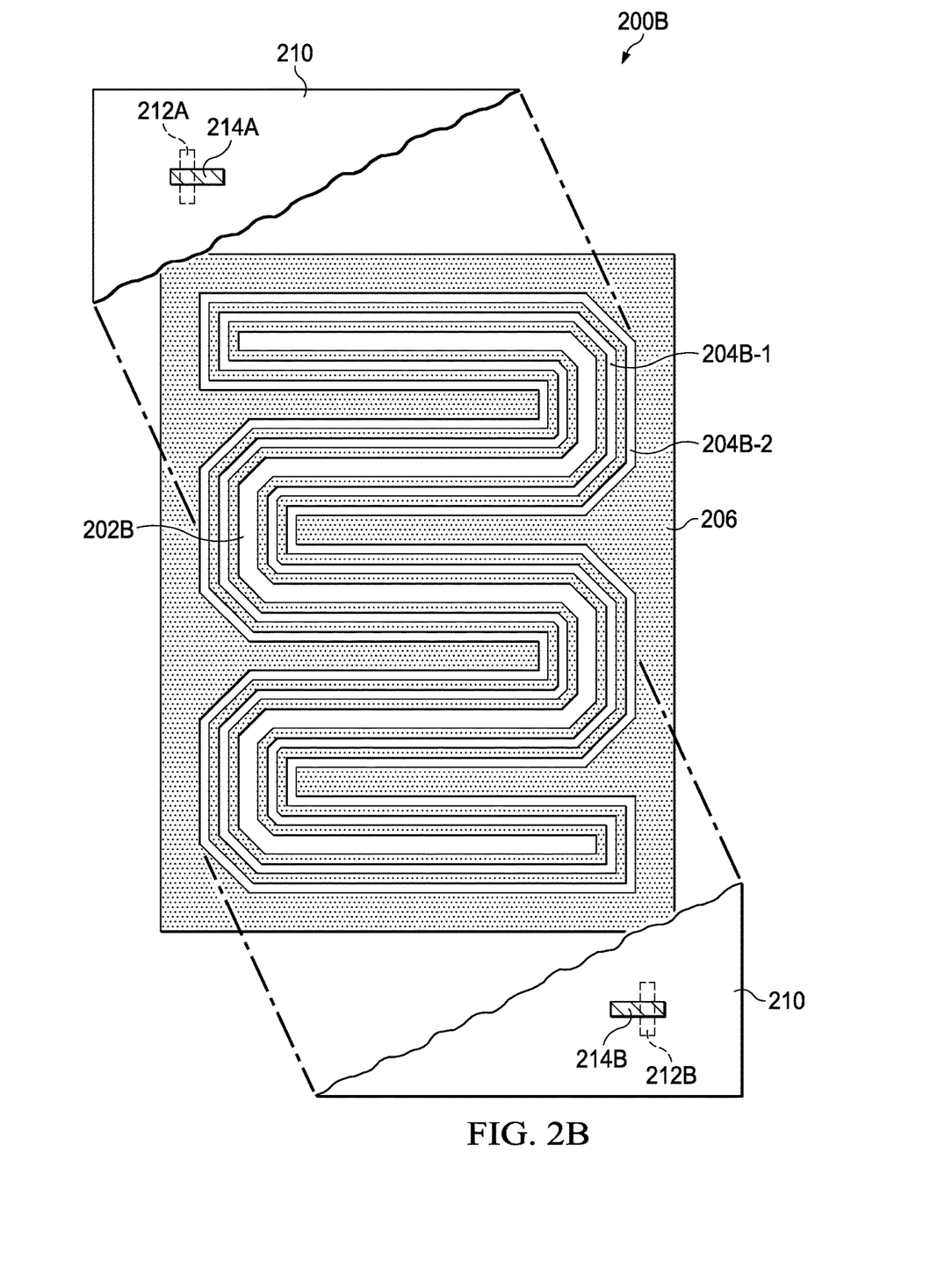
FIG. 2B depicts an example exploded top view of a first substrate with primary and secondary cavities formed in a different serpentine pattern, with overlying portions of the upper surface of a second substrate.

FIG. 1B discloses an example chip scale vapor cell 100B according to an embodiment of the disclosure. Chip scale vapor cell 100B includes a first substrate 106 sealed to a second substrate 110 using bonding material 108. In this embodiment, chip scale vapor cell 100B includes primary hermetic cavity 102, which forms the vapor cell, and secondary hermetic cavity 104, which provides a buffer cavity for leakage across the bonding material 108. Although it appears in FIG. 1B that two secondary hermetic cavities 104 are provided, FIGS. 2A and 2B depict example layouts of primary hermetic cavity 202 and secondary hermetic cavity 204 in substrate 206, demonstrate that secondary hermetic cavity 104 is actually a single cavity that surrounds the perimeter of primary hermetic cavity 102. Secondary hermetic cavity 104 is sealed simultaneously with primary hermetic cavity 102 and thus will initially have the same low internal pressure as primary hermetic cavity 102. As the local environment crosses the bonding material 108, the newly introduced gases will first be absorbed by secondary hermetic cavity 104 and will only then be able to pass into primary hermetic cavity 102, significantly delaying the rise in pressure in primary hermetic cavity 102. Secondary hermetic cavity 104 may have a volume that, at minimum, is one tenth the volume of the primary hermetic cavity 102, although at this minimum value, the life of primary hermetic cavity 102 will not be extended. In other embodiments, the secondary hermetic cavity 104 has a volume that is equal to or greater than the volume of the primary hermetic cavity 102 to provide absorption of a large amount of leakage without significantly affecting the pressure in primary hermetic cavity 102. Gettering agents 105 may be introduced into secondary hermetic cavity 104 to getter any gases that may be present and that may leak into secondary hermetic cavity 104.

Figure 1C:
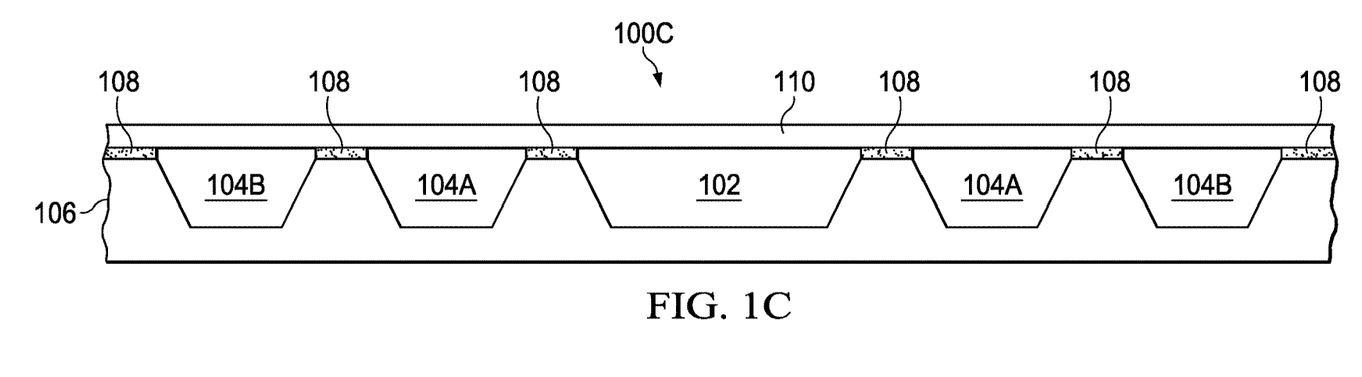
FIG. 1C depicts an example cross-section of a vapor cell having a buffer cell according to an embodiment of the disclosure.

FIG. 1C depicts a further example chip scale vapor cell 100C according to an embodiment of the disclosure. Chip scale vapor cell 100C includes primary hermetic cavity 102 formed by first substrate 106 and second substrate 110, which are bonded by bonding material 108. Secondary hermetic cavity 104A is formed around the perimeter of primary hermetic cavity 102 and secondary hermetic cavity 104B is formed around an outside perimeter of secondary hermetic cavity 104A. This configuration provides an additional level of buffering capability to the embodiment of FIG. 1B, as the pressure inside secondary hermetic cavity 104A cannot be compromised without first compromising the pressure inside secondary hermetic cavity 104B. A succession of additional buffer cavities can also be provided, limited only by matters of space and cost.

Figure 1D:
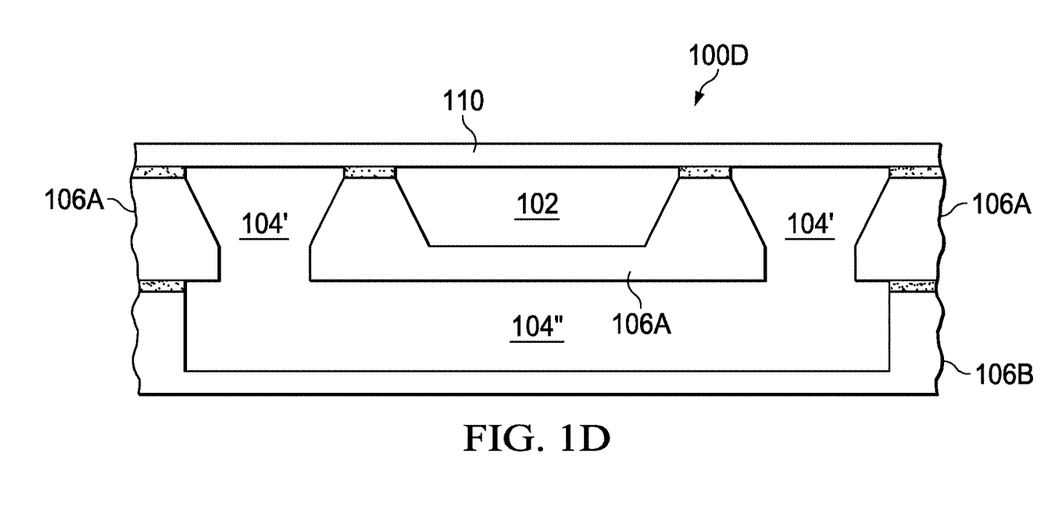
FIG. 1D depicts an example cross-section of a vapor cell having a buffer cell according to a further embodiment of the disclosure.

FIG. 1D depicts yet another chip scale vapor cell 100D according to an embodiment of the disclosure. Chip scale vapor cell 100D is formed from three separate substrates: first substrate 106A, second substrate 110 and third substrate 106B. Primary hermetic cavity 102 can be formed in substrate 106A in a usual manner. However, secondary hermetic cavity 104' is subjected to additional etching that removes all remaining substrate from a portion of the secondary hermetic cavity 104'. Substrate 106B, which has been etched to form a large cavity therein, is then bonded to substrate 106A to form the large secondary hermetic cavity 104", which is ultimately conjoined to hermetic cavity 104'. Once substrate 110 is bonded to substrate 106A, chip scale vapor cell 100D offers a large volume buffer cavity that can absorb large volumes of leakage without requiring additional lateral space on the chip.

FIG. 2A depicts an example layout 200A of substrate 206, in which the bottom wall and sidewalls of cavities for a vapor cell have been formed according to an embodiment of the disclosure. In FIG. 2A, as in FIG. 1B, a single secondary hermetic cavity is being created. Substrate 206 includes a primary cavity 202A that follows a serpentine route and forms a reverse S-shape in substrate 206. Secondary cavity 204A surrounds the perimeter of primary cavity 202A; once the substrate that forms the top walls of cavities 202A, 204A is bonded to substrate 206, leakage must cross secondary cavity 204A to reach primary cavity 202A. FIG. 2B depicts another example layout 200B of substrate 206, as well as portions of an upper surface of substrate 210 that is to be bonded to substrate 206. Layout 200B includes primary cavity 202B and two secondary cavities 204B-1, 204B-2. In layout 200B, primary cavity 202B follows a more serpentine path through substrate 206, with secondary cavity 204B-1 again surrounding the perimeter of primary cavity 202B. Secondary cavity 204B-2 follows a path that surrounds the outside perimeter of secondary cavity 204B-1 and will provide a further layer of protection against leakage.

As will be discussed in greater detail below, the interior of primary cavity 202B has a conductive surface that serves as a waveguide for an electromagnetic signal. This conductive surface may be formed only on the surfaces of the substrates that form the interior of the primary cavity 202B or may include the entire surfaces of the two substrates that will be bonded together. Two non-conductive apertures 212A, 212B are formed on the bottom surface of second substrate 210. For example non-conductive aperture 212A may allow the entry of an electromagnetic signal into primary cavity 202B, while non-conductive aperture 212B may allow the exit of the electromagnetic signal from primary cavity 202B. Conductive coupling structures 214A, 214B are formed on an upper surface of substrate 210 and overlying the non-conductive apertures 212A, 212B. Conductive coupling structure 214A can be coupled to a transceiver to provide the electromagnetic signal that is transmitted through primary cavity 202B and conductive coupling structure 214B can be coupled to the transceiver to receive the electromagnetic signal that has traversed the primary cavity 202B. As the frequency transmitted on conductive coupling structure 214A sweeps the region of the absorption line of water at 183 GHz, the signal received on conductive coupling structure 214B can be analyzed to determine the desired frequency and necessary corrections made.

Figure 2C:
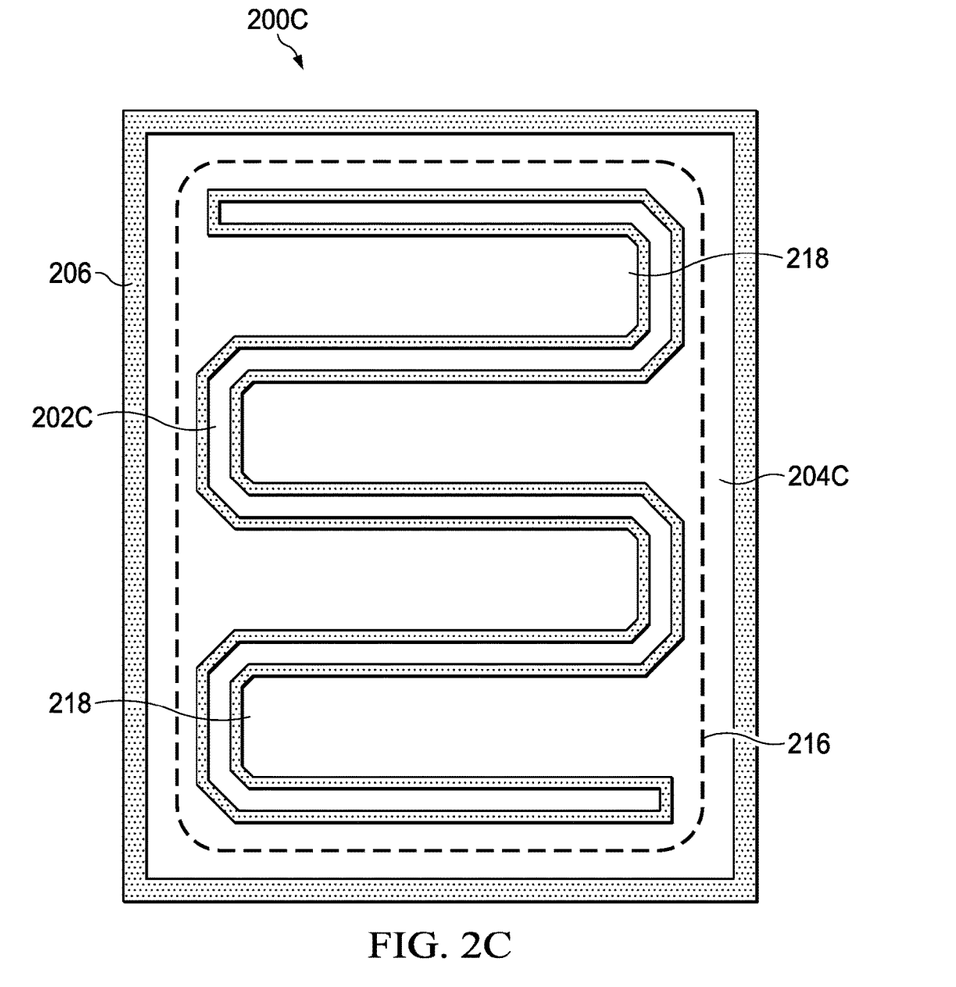
FIG. 2C depicts an example top view of a substrate with the secondary cavity forming a different pattern around the primary cavity.

FIGS. 2A and 2B illustrate embodiments in which secondary cavities closely follow the outline of the primary cavity. FIG. 2C discloses a further embodiment in which secondary cavity 204C forms a large ring around primary cavity 202C; this ring is emphasized by dotted line 216. Secondary cavity 204C may include only this outer ring, which surrounds but does not follow the perimeter of primary cavity 202C; secondary cavity 204C may optionally include "fingers" 218 that extend between sections of primary cavity 202C to provide further absorption area. The embodiments shown in FIGS. 2A-2C are meant to be illustrative only and are not intended to be limiting of the shapes or lengths that primary cavity 202 can follow, nor the path that secondary cavity 204 can take.

Examples of the materials used to form the chip scale vapor cells shown in this application follow. A more complete explanation of the formation of a chip scale vapor cell can be found in U.S. Patent Publication No. 20160291549, which is owned by the assignee of the present application and which is hereby incorporated by reference. In discussing the materials, reference is made to FIG. 1B, although this discussion applies to any embodiments. Substrate 106 and substrate 110 can comprise a wafer of silicon or other material into which the desired cavities can be etched using known methods. Other substrate materials can also be used, such as glass, metal, ceramic or other impermeable materials. In one embodiment, substrate 106 is a silicon wafer, while substrate 110 is a sheet of glass, such as Corning Eagle XG glass, a low-alkali borosilicate glass. As noted above, the interior of primary hermetic cavity 102, i.e., sidewalls 112, bottom wall 114 and top wall 116, is provided with a conductive surface that forms a waveguide for electromagnetic waves introduced into primary hermetic cavity 102. In one embodiment, the conductive surface is formed of copper. Two non-conductive apertures are provided, e.g., by etching, at opposite ends of top wall 116, for the introduction and retrieval of the electromagnetic waves as seen in FIG. 2B. Conductive coupling structures are formed on an outer surface of chip scale vapor cell 100B proximate to the non-conductive apertures such that a transceiver can be coupled to provide a signal into a first non-conductive aperture and receive a signal from a second non-conductive aperture. Bonding material 108 can comprise Au—Au, Au/In, Cu/Sn, Sn/Au, Sn/Ag, or any other bonding material that can provide bonding without introducing any unwanted gases inside the hermetic cavities 102, 104. Other bonding techniques can be used such as anodic bonding or fusion bonding.

Figure 3:
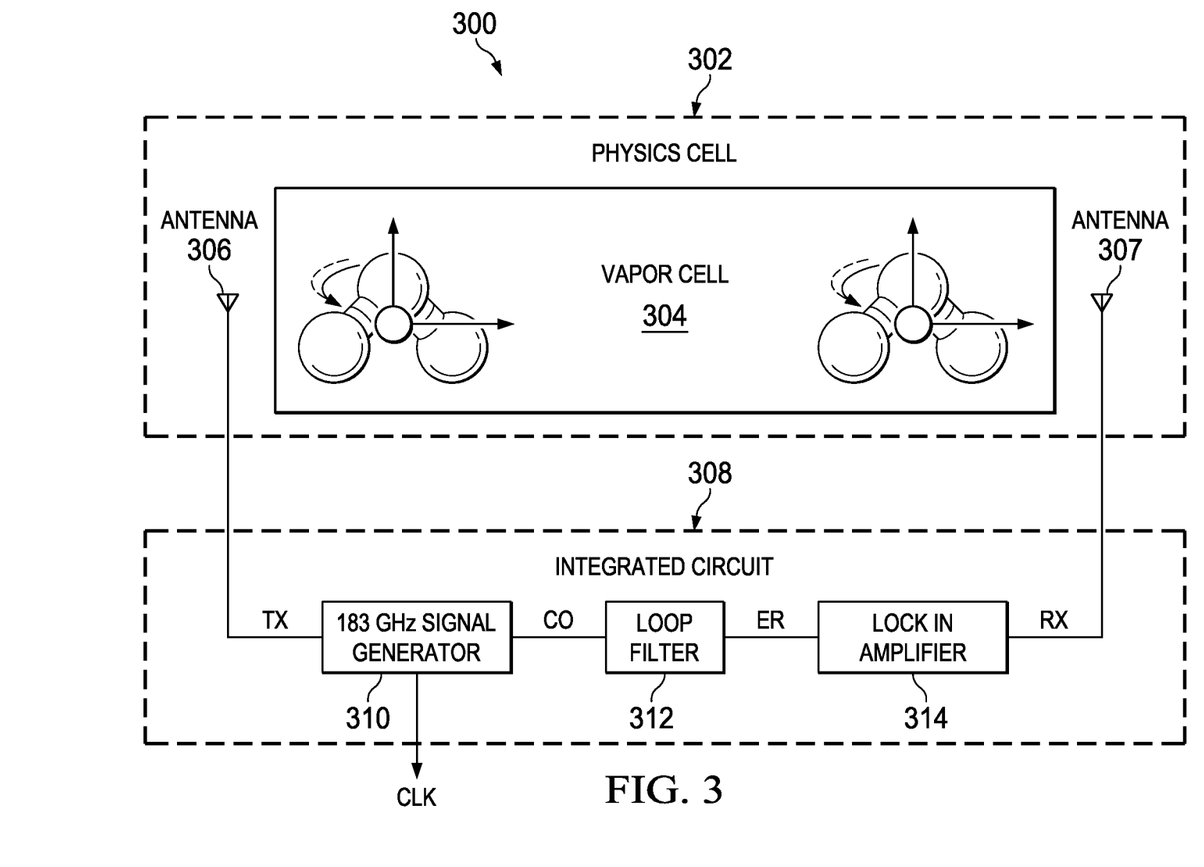
FIG. 3 depicts a block diagram of a millimeter wave CSAC according to an embodiment of the disclosure.

FIG. 3 depicts a block diagram of a millimeter wave CSAC 300 in which physics cell 302 is coupled to an integrated circuit 308 that interrogates physics cell 302 to provide a reference frequency. Physics cell 302 includes vapor cell 304 and antennae 306, 307. Integrated circuit 308 includes three elements: a signal generator 310, which is coupled to antenna 306 to provide a transmission signal, lock in amplifier 314, which is coupled to antenna 307 to receive the signal sent through vapor cell 304, and loop filter 312. In the embodiment shown in millimeter-wave CSAC 300, vapor cell 304 contains water vapor and signal generator 310 is configured to operate at 183 GHz. During operation of millimeter-wave CSAC 300, signal generator 310 provides an alternating electrical output signal TX to antenna 306, as well as a reference clock signal CLK at an output frequency. Lock-in amplifier 314 receives an input signal RX from antenna 307 and operates to provide an error signal ER that represents a difference between the received signal and the signal transmitted on antenna 306. This error signal can be used by loop filter 312 or other controller circuit to provide a control output signal CO to signal generator 310 for selectively adjusting the transmission output frequency to maintain the output frequency at a peak absorption frequency of the dipolar molecular vapor inside vapor cell 304.

Figure 4:
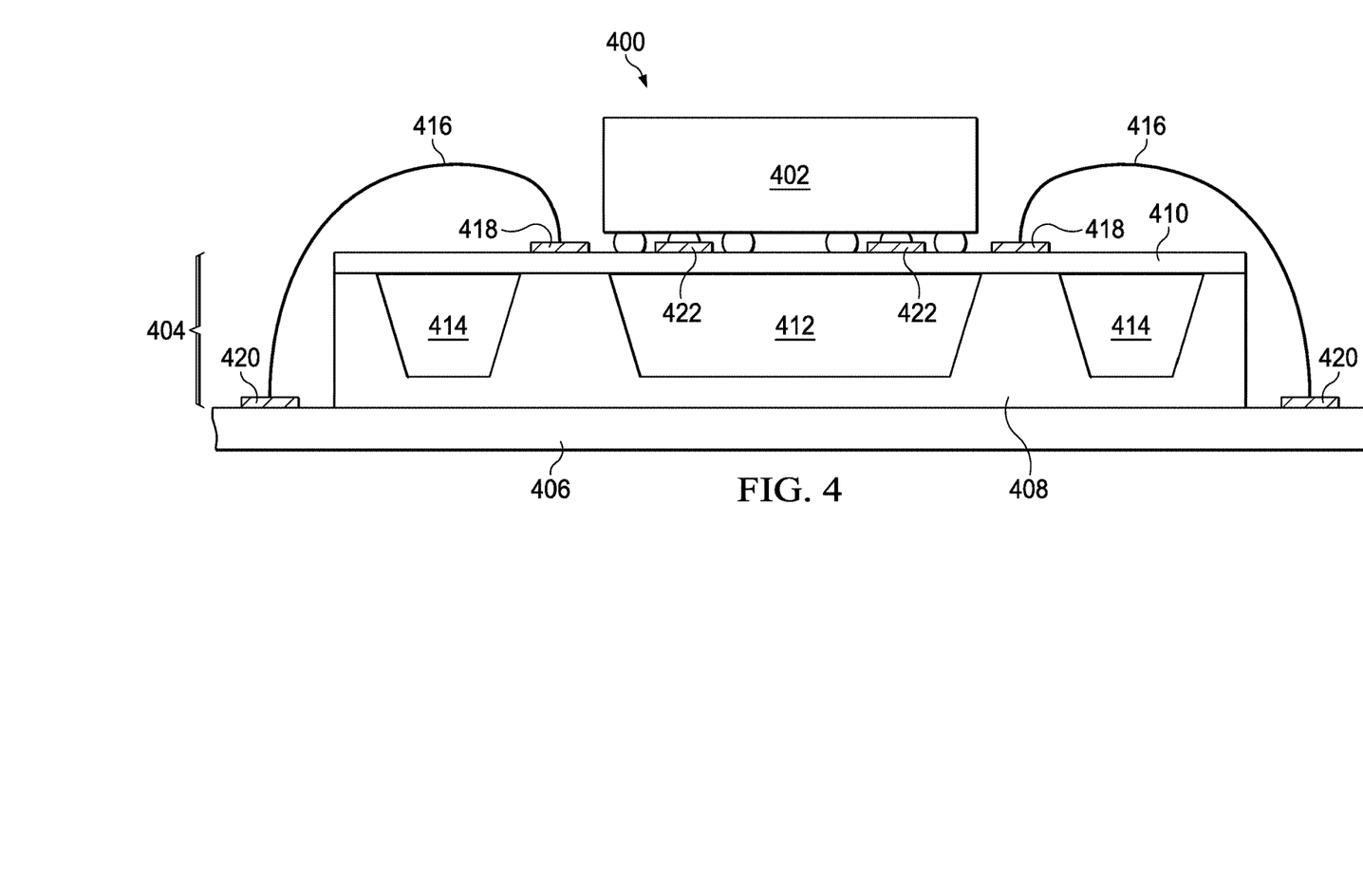
FIG. 4 depicts a package for a millimeter wave CSAC according to an embodiment of the disclosure.

FIG. 4 depicts a millimeter wave CSAC package 400, which includes millimeter wave transceiver 402 mounted to physics package 404, which in turn in mounted to packaging substrate 406. Physics package 404 includes vapor cell 412, which is a hermetic cavity formed by sealing substrate 408 to substrate 410 under very low pressure. Buffer cavity 414 is formed simultaneously with vapor cell 412 and under the same conditions and helps to preserve the integrity of vapor cell 412 for an extended period of time. In one embodiment, vapor cell 412 contains water vapor at 0.1 mbars and 40% humidity and millimeter wave transceiver 402 operates at 183 GHz. At 183 GHz, signals from millimeter wave transceiver 402 cannot be transmitted by wire. Accordingly, millimeter wave transceiver 402 is mounted directly to the conductive coupling structures 422 on the surface of substrate 410 using a ball grid array. Once millimeter wave transceiver 402 receives the output signal from physics cell 404, the signal is processed and a clock signal is transmitted at a lower frequency for use by additional circuits using contact pads 418, 420 and bonding wires 416.

A structure has been disclosed for a primary hermetic cavity that is surrounded by one or more secondary hermetic cavities formed simultaneously with the primary hermetic cavity. The secondary hermetic cavity provides buffering that can absorb leakage across the bonding surface and allow the primary hermetic cavity to maintain functional capabilities for a longer period of time than otherwise possible. The secondary hermetic cavity may include gettering agents that absorb leakage into the secondary cavities. The layout of primary hermetic cavity can take any shape that can provide for the interrogation of an electromagnetic signal transmitted through the primary hermetic cavity. If a single secondary cavity is used, the layout of secondary cavity surrounds the perimeter of the primary cavity. Additional secondary cavities can be provided, with each added secondary cavity surrounding an outside perimeter of a previous secondary cavity. A secondary cavity may surround a perimeter of either the primary cavity or another secondary cavity without necessarily following the outline of the surrounded cavity.

Although the disclosed embodiments have been described primarily in terms of a vapor cell that utilizes water as a dipolar molecule in the vapor cell at a pressure of 0.1 mbar, the pressure requirements for other gases or other uses may require a different pressure. In one example embodiment, an initial pressure of 1.0 mbar is utilized in the vapor cell.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A chip scale vapor cell comprising:
   a first substrate;
   a second substrate bonded to the first substrate with a bonding material, the second substrate comprising an upper surface and a lower surface;
   a primary hermetic cavity comprising: a first bottom wall and first sidewalls formed in the first substrate; and a first top wall formed by the lower surface of the second substrate;
   a secondary hermetic cavity comprising a second bottom wall and second sidewalls formed in the first substrate, and a second top wall formed by the lower surface of the second substrate, the secondary hermetic cavity being separate from the primary hermetic cavity, and the secondary hermetic cavity comprising: a first region surrounding a perimeter of the primary hermetic cavity; and a second region lying under the primary hermetic cavity, the first and second regions being conjoined; and
   a gas sealed in the primary hermetic cavity and the secondary hermetic cavity at an initial pressure, the gas comprising a dipolar molecule.

2. The chip scale vapor cell of claim 1, wherein the initial pressure is less than 1.0 mbar.

3. The chip scale vapor cell of claim 1, wherein the initial pressure is approximately 0.1 mBar or less.

4. The chip scale vapor cell of claim 1, wherein the gas comprises water vapor.

5. The chip scale vapor cell of claim 1, wherein a volume of the secondary hermetic cavity is equal to or greater than one tenth the volume of the primary hermetic cavity.

6. The chip scale vapor cell of claim 1, wherein a volume of the secondary hermetic cavity is equal to or greater than a volume of the primary hermetic cavity.

7. The chip scale vapor cell of claim 1, wherein the secondary hermetic cavity comprises a gettering agent to absorb the dipolar molecule.

8. A chip scale vapor cell comprising:
   a first substrate;

a second substrate bonded to the first substrate with a bonding material, the second substrate comprising an upper surface and a lower surface;

a primary hermetic cavity comprising a first bottom wall and first sidewalls formed in the first substrate and a first top wall formed by the lower surface of the second substrate;

a secondary hermetic cavity comprising a second bottom wall and second sidewalls formed in the first substrate, a second top wall formed by the lower surface of the second substrate, the secondary hermetic cavity being separate from the primary hermetic cavity and surrounding a perimeter of the primary hermetic cavity; and a gas sealed in the primary hermetic cavity and the secondary hermetic cavity at an initial pressure, the gas comprising a dipolar molecule;

the first bottom wall, first sidewalls and first top wall comprising a conductive surface, and the first top wall comprising: a first non-conductive aperture on the lower surface of the second substrate that provides an electromagnetic field entrance to the primary hermetic cavity; and a second non-conductive aperture on the lower surface of the second substrate; and spaced from the first non-conductive aperture, that provides an electromagnetic field exit from the primary hermetic cavity.

9. The chip scale vapor cell of claim 8, further comprising: a first conductive coupling structure formed on the upper surface of the second substrate proximate the first non-conductive aperture; and a second conductive coupling structure formed on the upper surface of the second substrate proximate the second non-conductive aperture.

10. A millimeter wave atomic clock apparatus comprising:
    a vapor cell, comprising:
        a first substrate,
        a second substrate bonded to the first substrate with a bonding material, the second substrate comprising an upper surface and a lower surface,
        a primary hermetic cavity comprising a first bottom wall and first sidewalls formed in the first substrate and a first top wall formed by the lower surface of the second substrate,
        a secondary hermetic cavity comprising a second bottom wall and second sidewalls formed in the first substrate, a second top wall formed by the lower surface of the second substrate, the secondary hermetic cavity being separate from the primary hermetic cavity, the secondary hermetic cavity surrounding a perimeter of the primary hermetic cavity and
        a dipolar molecular gas sealed in the primary hermetic cavity and the secondary hermetic cavity at a given initial pressure; and
    a transceiver circuit mounted to the second substrate and electrically coupled to provide an alternating electrical output signal at a first end of the primary hermetic cavity and to receive an alternating electrical input signal at a second end of the primary hermetic cavity, the transceiver circuit coupled to selectively adjust a frequency of the alternating electrical output signal and to provide a reference clock signal.

11. The millimeter wave atomic clock apparatus of claim 10, wherein the first bottom wall, the first sidewalls and the first top wall comprise a conductive surface and the first top wall further comprises a first non-conductive aperture for providing an electromagnetic field entrance to the primary hermetic cavity and a second non-conductive aperture spaced from the first non-conductive aperture for providing the electromagnetic field exit from the primary hermetic cavity.

12. The millimeter wave atomic clock apparatus of claim 11, wherein the vapor cell further comprises:
    a first conductive coupling structure formed on the upper surface of the second substrate proximate the first non-conductive aperture and coupled to receive the alternating electrical output signal from the transceiver circuit,
    a second conductive coupling structure formed on the upper surface of the second substrate proximate the second non-conductive aperture and coupled to provide the alternating electrical input signal to the transceiver circuit.

13. The millimeter wave atomic clock apparatus of claim 12, wherein the initial pressure is approximately 0.1 mBar or less.

14. The millimeter wave atomic clock apparatus of claim 13, wherein the dipolar molecular gas comprises water vapor.

15. The millimeter wave atomic clock apparatus of claim 14, wherein the secondary hermetic cavity comprises a first region that surrounds the perimeter of the primary hermetic cavity and a second region that lies under the primary hermetic cavity, the first and second regions being conjoined.

16. The millimeter wave atomic clock apparatus of claim 14, wherein the secondary hermetic cavity comprises a plurality of secondary hermetic cavities, a first secondary hermetic cavity of the plurality of secondary hermetic cavities surrounding the perimeter of the primary hermetic cavity and each successive secondary hermetic cavity of the plurality of secondary hermetic cavities surrounding an outside perimeter of a previous secondary hermetic cavity.

* * * * *